United States Patent [19]

Sibley

[11] Patent Number: 5,514,439
[45] Date of Patent: May 7, 1996

[54] WAFER SUPPORT FIXTURES FOR RAPID THERMAL PROCESSING

[76] Inventor: Thomas Sibley, 5439 McCommas, Dallas, Tex. 75206

[21] Appl. No.: 323,265

[22] Filed: Oct. 14, 1994

[51] Int. Cl.$^6$ ........................................................ B32B 3/02
[52] U.S. Cl. .................... 428/64.1; 118/500; 118/725; 118/730; 219/638; 219/649; 428/156; 428/408; 428/698; 428/704
[58] Field of Search .................. 428/64, 66, 156, 428/408, 698, 704; 118/500, 725, 730; 219/638, 649

[56] References Cited

U.S. PATENT DOCUMENTS

| | | | |
|---|---|---|---|
| 4,301,132 | 11/1981 | Kennedy | 501/90 |
| 4,761,134 | 8/1988 | Foster | 432/253 |
| 4,962,441 | 10/1990 | Collins | 118/500 |
| 4,978,567 | 12/1990 | Miller | 428/157 |
| 5,192,371 | 3/1993 | Shuto | 118/500 |

FOREIGN PATENT DOCUMENTS 246931  11/1991  Japan ........................................ 118/500

OTHER PUBLICATIONS

"Electrical Conductivity Calculations For GH–SiC" by M. Ghezzo, Tech. Info. Series, GE Research & Development Center, Mar. 1992.

Primary Examiner—Nasser Ahmad
Attorney, Agent, or Firm—Gary C. Honeycutt

[57] ABSTRACT

A fixture for supporting a semiconductor wafer during rapid thermal processing, comprising a two-piece assembly of parts, one of which is a silicon carbide wafer support section having a wafer contact face shaped by direct contact with a mold, during its formation by chemical vapor deposition. The other piece is a holding section shaped to keep the wafer support section in place within the reactor. The two-piece assembly improves thermal performance, compared with a one-piece fixture, because the rate of heat conduction across the gap between parts is always less than the rate of heat conduction through a one-piece fixture having the same dimensions.

7 Claims, 1 Drawing Sheet

WAFER SUPPORT FIXTURES FOR RAPID THERMAL PROCESSING

FIELD OF THE INVENTION

This invention relates to the rapid thermal processing of workpieces, such as semiconductor wafers, for example; and more particularly to fixtures for supporting such wafers in a high-temperature reactor, including methods for the fabrication of such fixtures.

BACKGROUND OF THE INVENTION

Rapid thermal processing of semiconductor wafers is well known, and the need for a wafer support fixture having a low effective thermal mass, chemical stability in the presence of extremely corrosive conditions, and physical stability when exposed to high temperatures and rapid thermal cycling over an extended period of time, has been recognized. More specifically, it has also been recognized that silicon carbide is a superior material for construction of such fixtures. See for example U.S. Pat. No. 4,978,567 issued to Michael Miller on Dec. 18, 1990, incorporated herein by reference.

The fixture of the Miller patent consists of silicon carbide, and is fabricated by chemical vapor deposition of the carbide on a graphite substrate, followed by destructive oxidation to remove the graphite. Note particularly that the Miller fixture is a single piece of silicon carbide, including a wafer support surface formed integrally with an annular surface surrounding the wafer support, and further including an annular sidewall, integral therewith and perpendicular to the wafer support surface, for holding the wafer support surface at the proper height.

In the Miller fabrication method, the graphite interface with deposited silicon carbide is always formed on the back side of the wafer support section, opposite the support face designed for contact with the semiconductor wafer. As a result, there is no convenient technique for providing such a wafer support face with a precisely planar finish. Also, the Miller process does not allow the mold to be used for providing precisely detailed structural features in the support face.

Other known fixtures are composed of high-purity graphite, coated with a thin layer of CVD silicon carbide. The coating is required in order to seal the surface of the graphite, so that the graphite cannot contaminate the reactor system. Grinding of the coated surface may or may not be required, depending upon the intricacy of surface features, and the degree of precision desired.

Such coated graphite fixtures have known disadvantages, including a limited lifetime due to stresses developed during thermal cycling, because the silicon carbide coating has a different coefficient of thermal expansion (CTE), compared with the graphite. Long before the coating develops visible cracks, it begins to "leak" and thereby allow the underlying graphite to contaminate the system. If thicker coatings are applied in an attempt to avoid the problem, the cracks appear even sooner.

Despite these disadvantages, the coated graphite fixtures have found some degree of success, particularly when used in reactors equipped with induction heating, since graphite has the electrical conductivity required to enable use of these support sections as susceptors for induction heating. Thus, any material selected to replace coated graphite in such fixtures should preferably exhibit all the desirable features of silicon carbide, and also have the conductivity needed for inductive heating.

Recent advances in rapid thermal processing have also led to the requirement that the wafer support section of a fixture be as thin as possible, so that more rapid thermal cycling can be achieved. But the flexible character of graphite places a severe limitation upon the use of coated graphite for thinner support sections, since thermal processing and repeated thermal cycling will cause such support sections to lose planarity. Pure silicon carbide will not lose its planarity, even when thinned to 20 mils or less.

SUMMARY OF THE INVENTION

In accordance with one aspect of the present invention, an improved silicon carbide wafer support fixture for use in rapid thermal processing is provided, comprising an assembly of two or more parts, one such part consisting essentially of a silicon carbide wafer support section, while the remaining part or parts are adapted to hold the wafer support section in place within the reactor.

The wafer support section of the invention is generally a disk-shaped structure having no sidewall. The other part or parts that hold the wafer support section in place may also consist of silicon carbide; however, other materials such as silicon, silicon-coated graphite, or quartz may be used.

A structure comprising two or more pieces allows the wafer support section to be fabricated separately from the remainder of the fixture, thereby enabling the use of conventional equipment for precise grinding and/or polishing of both sides of the wafer support section. As an alternative, separate fabrication of the wafer support section facilitates the use of a graphite mold in direct contact with the wafer support face, in order to shape the face of the support section during SiC deposition, so that intricate features may be provided in the wafer contact face without grinding, or with minimal grinding.

Even when a precisely planar, featureless contact face is desired, it is more efficient to planarize the mold, and thereby produce a planar contact face, so that little or no grinding will be required. Still further, the assembly of two or more reduces the rate of heat transfer between the wafer support section and the remainder of the fixture.

In one embodiment, the upper face of the wafer support section is provided with an array or matrix of raised features having coplanar peaks, such that a wafer supported thereon contacts only the peaks, thereby minimizing the total area of contact with the wafer. This minimizes thermal interaction between the wafer and the support face. The raised features may have various shapes, including conical, pyramidal or rectangular, for example.

In another embodiment, the wafer contact face of the support is ground and/or polished to provide a precisely planar, featureless face. Such grinding or polishing is not readily feasible for the Miller fixture, because of its one-piece structure, since the pressure required on the support face cannot easily be offset or balanced from the backside, without complicating the procedure and increasing the risk of breakage.

Another aspect of the invention relates to methods for the fabrication of such a fixture, comprising the steps of shaping a graphite mold to provide a planar array of identical pockets on one face, such that the deposit of silicon carbide thereon, followed by removal of the graphite mold, produces a wafer support section having a wafer contact face that includes a planar array of raised features having coplanar peaks, as described above.

DETAILED DESCRIPTION OF THE DRAWINGS

Figure 1:
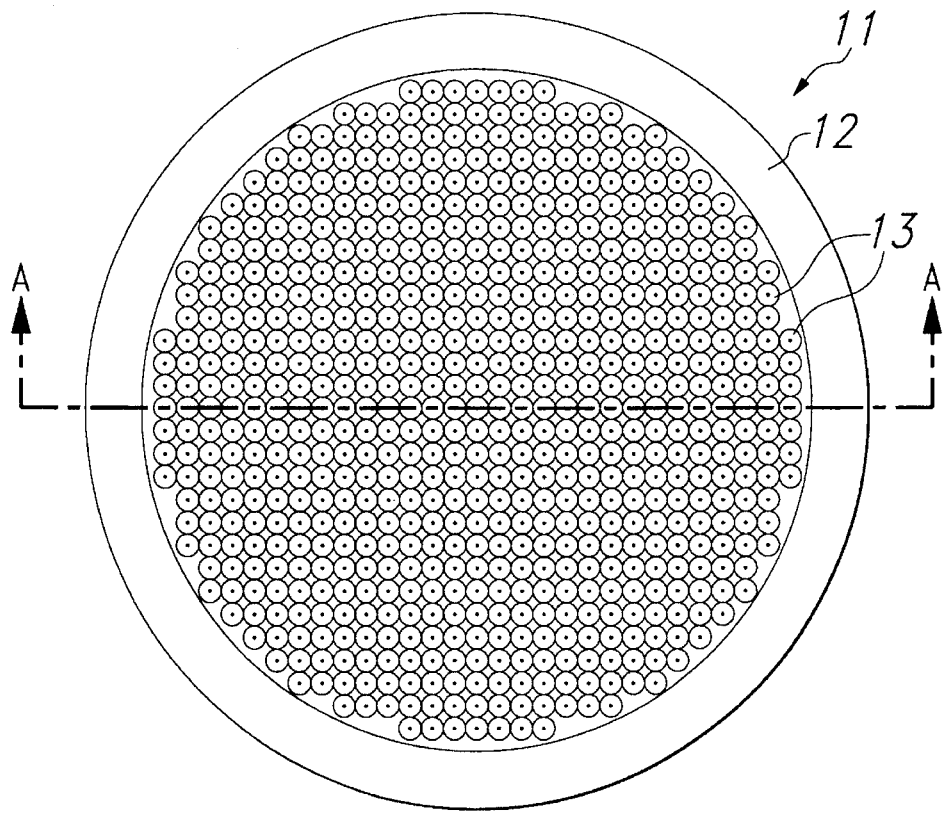
FIG. 1 is a top view of the wafer support section of one embodiment of the fixture of the invention.

As shown in FIG. 1, wafer support section 11 includes an annular surface 12 that surrounds the perimeter of the wafer contact surface. An array of raised features 13 having conical shapes and coplanar peaks is provided on the wafer contact surface, in order to minimize the total area of wafer contact, and thereby minimize thermal interaction between the wafer and the wafer contact surface of the fixture.

Figure 2:
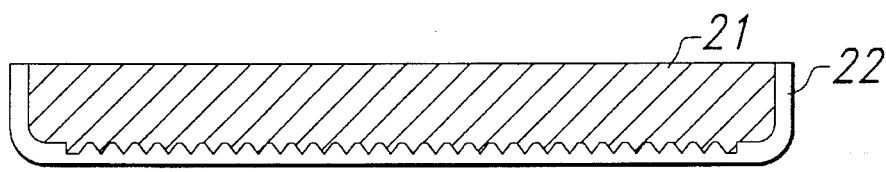
FIG. 2 is a cross sectional view of the wafer support section of FIG. 1, during fabrication.
Figure 3:
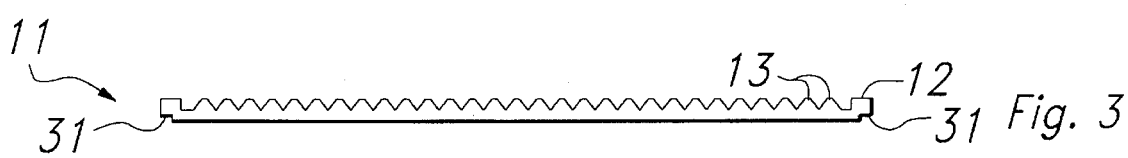
FIG. 3 is a cross sectional view of the wafer support section of FIG. 1, taken along line A-A.

In FIG. 2, the preferred method for fabrication of wafer support section 11 is seen to include the step of shaping graphite mold 21 so that one surface thereof includes an array of coplanar conical pockets, followed by the step of depositing silicon carbide layer 22 on the mold. Thereafter the mold is removed by destructive oxidation, for example, followed by grinding the carbide to remove unwanted peripheral portions, and to provide an inverted ledge 31 to fit with the holding section of the fixture, as shown in FIG. 3. The completed wafer contact face is seen to include raised features 13, shaped by the surface of the mold, without any need for subsequent grinding.

Minimizing or eliminating a grinding step is very important, because any substantial grinding of such fixtures inherently causes microscopic weaknesses or cracks to be formed in the remaining structure, thereby reducing its resistance to breakage, and also reducing its thermal stability after repeated use at high temperatures. Both of these effects can dramatically reduce the life expectancy of a fixture produced by a process that includes substantial grinding, especially when grinding is used to form intricate features.

Figure 4:
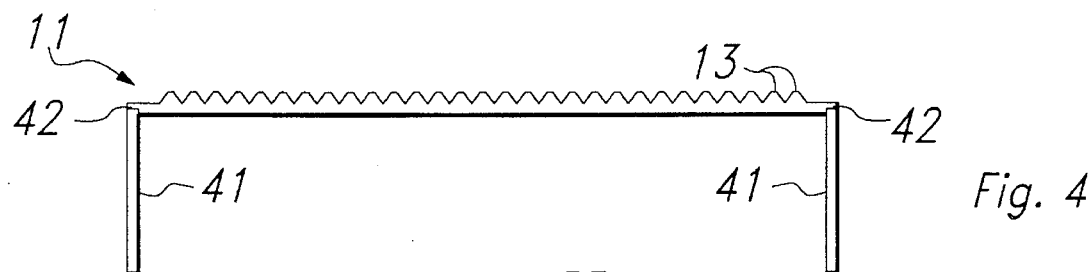
FIG. 4 is a cross sectional view of another embodiment of the fixture of the invention, fully assembled.

A fully assembled embodiment of the fixture is shown in FIG. 4, which includes annular holding section 41, having an upper edge 42 that fits with inverted ledge 31 of the wafer support section. Although holding section 41 is annular, and contacts the support section near its outer periphery, other embodiments of the invention include holding sections having different shapes, and which contact the support section near the center of its back side, for example, or intermediate its center and its periphery. Also, note that annular surface 12 in FIG. 3 is coplanar with the peaks of features 13, whereas in the structure of FIG. 4, the feature peaks are not coplanar with the surrounding surface.

The two-piece assembly of the invention provides improved thermal performance, compared with a one-piece fixture, because the rate of heat conduction across the gap between pieces will always be less than the rate of heat conduction through a one-piece construction having the same dimensions.

Figure 5:
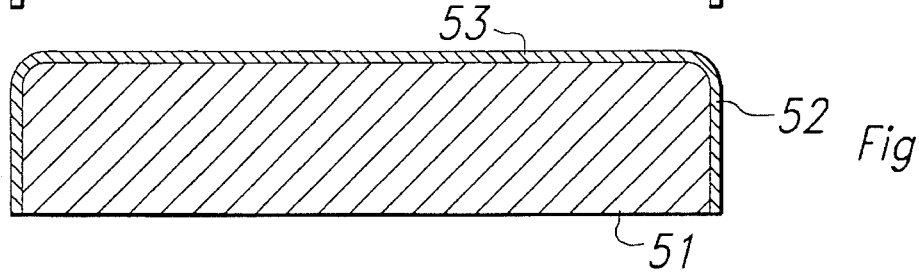
FIG. 5 is a cross sectional view of one step in the fabrication of a member used to hold the wafer support section in place.

In FIG. 5, a method for the fabrication of holding section 41 is illustrated, including the step of shaping graphite mold 51, followed by depositing SiC layer 52 thereon. Unwanted surface 53 is then ground away or discarded, and the mold removed.

The invention also includes a fixture having a wafer support section composed of silicon-rich silicon carbide. Such a composition has greater electrical conductivity than pure silicon carbide, sufficient to enable its use as a susceptor for induction heated systems. The electrical conductivity of silicon carbide can also be increased by the addition of boron or nitrogen, instead of or in combination with the addition of excess silicon. The use of such alternate compositions is also within the scope of the invention. For example, 0.001% to 10% excess silicon, or 0.001% to 10% boron or nitrogen, added to silicon carbide provides the necessary electrical conductivity.

What is claimed is:

1. A fixture for supporting a semiconductor wafer during rapid thermal processing, comprising an assembly of at least two separate pieces, one of which is a silicon carbide wafer support section having a wafer contact surface, said wafer support section consisting essentially of a disk-shaped member; and a second piece comprising means for holding said wafer support section in place within a reactor, said silicon carbide contains silicon in addition to the silicon that is combined with carbon to form said silicon carbide, the amount of additional silicon being sufficient to increase the electrical conductivity of the composition, compared with the electrical conductivity of pure silicon carbide.

2. A fixture as in claim 1 wherein said wafer contact surface includes means for minimizing thermal interaction between the wafer and said wafer support section.

3. A fixture as in claim 2, wherein said means for minimizing thermal interaction includes a plurality of raised elements integral with the wafer contact surface, located such that a small separation is maintained between the base of the contact surface and the wafer.

4. A fixture for supporting a semiconductor wafer during rapid thermal processing, comprising a wafer support section consisting essentially of a silicon carbide disk having a wafer contact surface that includes means for minimizing thermal interaction between the wafer and said contact surface, said disk having a substantially uniform thickness throughout, except for the portions that include said means for minimizing thermal interaction, said silicon carbide contains an additive for increasing the electrical conductivity of the fixture, selected from (a) silicon in addition to the silicon that is combined with carbon to form said silicon carbide, (b) nitrogen, and (c) boron.

5. A fixture as in claim 4, wherein said means for minimizing thermal interaction includes a plurality of raised elements integral with the wafer contact surface, located such that a small separation is maintained between the base of the wafer contact surface and the wafer.

6. A fixture as in claim 3, wherein each of said elements has a conical, or pyramidal, or rectangular shape.

7. A fixture as in claim 5 wherein each of said elements has a conical, or pyramidal, or rectangular shape.

\* \* \* \* \*